(12) United States Patent
Delacruz

(10) Patent No.: US 10,763,055 B2
(45) Date of Patent: Sep. 1, 2020

(54) PIN CONFIGURABLE SMART CURRENT SENSOR

(71) Applicant: TE CONNECTIVITY CORPORATION, Berwyn, PA (US)

(72) Inventor: Robert Steve Felisilda Delacruz, Columbus, OH (US)

(73) Assignee: TE CONNECTIVITY CORPORATION, Berwyn, PA (US)

(*) Notice: Subject to any disclaimer, the term of this patent is extended or adjusted under 35 U.S.C. 154(b) by 122 days.

(21) Appl. No.: 15/693,981

(22) Filed: Sep. 1, 2017

(65) Prior Publication Data
US 2019/0074145 A1  Mar. 7, 2019

(51) Int. Cl.
| | |
|---|---|
| H01H 9/54 | (2006.01) |
| H02H 3/18 | (2006.01) |
| H02H 3/08 | (2006.01) |
| G01R 15/20 | (2006.01) |
| G01R 19/165 | (2006.01) |
| H02H 5/04 | (2006.01) |

(52) U.S. Cl.
CPC .......... H01H 9/54 (2013.01); G01R 15/202 (2013.01); G01R 19/16538 (2013.01); H02H 3/08 (2013.01); H02H 3/18 (2013.01); H02H 5/04 (2013.01)

(58) Field of Classification Search
CPC ... H01H 9/54; G01R 15/202; G01R 19/16538
USPC ...................................................... 307/131
See application file for complete search history.

(56) References Cited

U.S. PATENT DOCUMENTS

| | | | | |
|---|---|---|---|---|
| 5,579,194 A | * | 11/1996 | Mackenzie | .......... H01H 47/325 |
| | | | | 341/128 |
| 5,652,507 A | * | 7/1997 | Blakely | .................. G01R 15/18 |
| | | | | 323/356 |
| 5,856,711 A | * | 1/1999 | Kato | ...................... H02H 3/087 |
| | | | | 307/10.6 |

(Continued)

FOREIGN PATENT DOCUMENTS

| | | |
|---|---|---|
| EP | 1 113 571 A2 | 7/2001 |
| JP | H07 55844 A | 3/1995 |

(Continued)

OTHER PUBLICATIONS

International Search Report, International Application No. PCT/IB2018/056643, International Filing Date, Aug. 30, 2018.

*Primary Examiner* — Daniel Kessie
*Assistant Examiner* — Brian K Baxter

(57) ABSTRACT

A method of regulating the operation of an electrical system, the electrical system including, a contactor unit including a contactor and a conductive element, sensing circuitry including at least two Hall Effect sensors, and a control unit including at least a trip circuit, an I2t unit, and a one coil current monitor. The method includes receiving, by the control unit, one or more first measurements, from the sensing circuitry and determining, by the control unit, a current corresponding to a current in the at least one conductive element based on the one or more first measurements. The control unit also determines an instantaneous power generated by a load based on the current and regulates the operation of the contactor unit based on the power generated by the load.

9 Claims, 2 Drawing Sheets

(56) References Cited

U.S. PATENT DOCUMENTS

| | | | |
|---|---|---|---|
| 6,208,121 B1* | 3/2001 | Barber | H02M 3/156 323/222 |
| 6,316,931 B1 | 11/2001 | Nakagawa et al. | |
| 6,433,981 B1* | 8/2002 | Fletcher | G01R 19/0092 323/234 |
| 7,746,065 B2 | 6/2010 | Pastre et al. | |
| 8,232,813 B2 | 7/2012 | Burdett et al. | |
| 8,599,512 B2 | 12/2013 | Hogg | |
| 8,963,535 B1* | 2/2015 | Melanson | G01R 33/07 307/116 |
| 9,612,262 B1* | 4/2017 | Nehmeh | G01R 15/202 |
| 2004/0183522 A1* | 9/2004 | Gunn | G01R 15/185 324/126 |
| 2006/0071557 A1* | 4/2006 | Osawa | B60L 3/0046 307/10.1 |
| 2007/0096716 A1 | 5/2007 | Shoji | |
| 2007/0267978 A1 | 11/2007 | Shteynberg | |
| 2009/0039869 A1 | 2/2009 | Williams | |
| 2011/0316351 A1* | 12/2011 | Juby | H02H 7/04 307/117 |
| 2013/0099765 A1* | 4/2013 | Girard | H02J 7/0031 323/282 |
| 2015/0276877 A1* | 10/2015 | Biswas | G01R 31/3275 702/58 |
| 2015/0326001 A1 | 11/2015 | Emerson et al. | |
| 2016/0035526 A1* | 2/2016 | Mittlestadt | H01H 71/126 200/50.02 |
| 2018/0315566 A1* | 11/2018 | Delacruz | H01H 47/002 |
| 2019/0072587 A1* | 3/2019 | Delacruz | G01R 15/202 |

FOREIGN PATENT DOCUMENTS

| | | |
|---|---|---|
| KR | 101 043 891 B1 | 6/2011 |
| KR | 2013 0016869 A | 2/2013 |
| WO | 2005 / 091958 A2 | 10/2005 |

* cited by examiner

PIN CONFIGURABLE SMART CURRENT SENSOR

FIELD OF THE INVENTION

The present invention is directed to a current sensor. In particular, the present invention is directed to a configurable current sensor able to measure large currents.

BACKGROUND OF THE INVENTION

Current sensors are frequently employed to measure current in a variety of applications including microelectronics and power systems. Hall Effect current sensors generate a voltage in response to a magnetic field generated by a current. The Hall voltage of the sensor is based on the magnitude and direction of the current producing the magnetic field.

BRIEF DESCRIPTION OF THE INVENTION

In an embodiment, a method of regulating the operation of an electrical system, the electrical system including, at least one contactor unit including a contactor and a conductive element, sensing circuitry including at least two Hall Effect sensors, and a control unit including at least a trip circuit, an I2t unit, and at least one coil current monitor. The method includes receiving, by the control unit, one or more first measurements, from the sensing circuitry and determining, by the control unit, a current corresponding to a current in the at least one conductive element based on the one or more first measurements. The method also includes determining, by the control unit the instantaneous power generated by a load based on the current and regulating, by the control unit, the operation of the at least one contactor unit based on the power generated by the load.

In another embodiment, an electrical system including a conductive element configured to transfer a current between a current source and a load and a contactor electrically coupled to the conductive element and configured to regulate the current in the conductive element. The system also includes a sensing circuit comprising at least two Hall Effect sensors and a control unit configured to regulate the operation of the contactor.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided is system employing a Hall Effect sensor to regulate the operation of electrical equipment. Embodiments of the present disclosure, for example, in comparison to concepts failing to include one or more of the features disclosed herein, provide a control system to energize and/or de-energize an electrical circuit based on Hall Effect current measurements.

Figure 1:
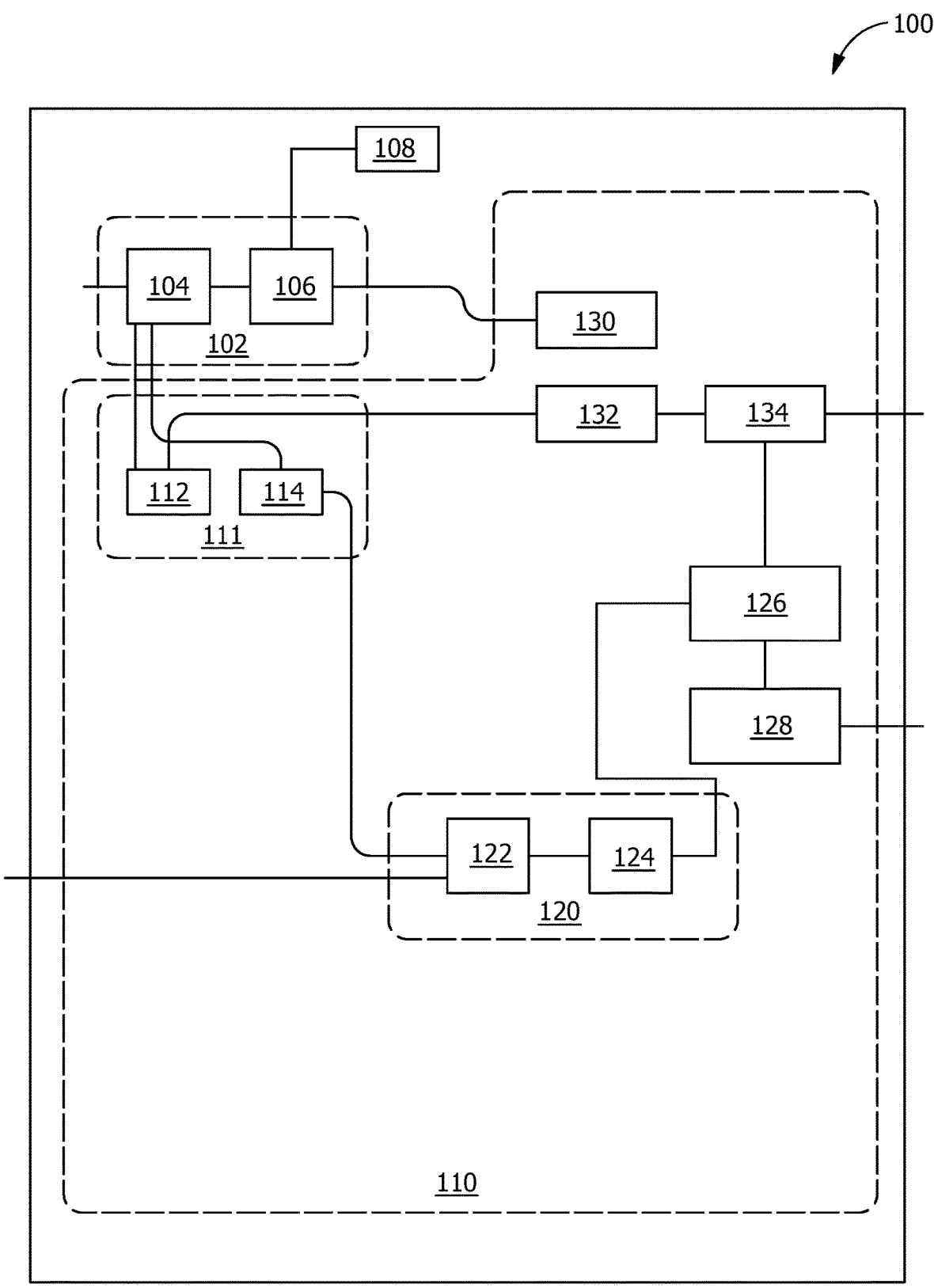
FIG. 1 is a block diagram of an electrical system, according to an embodiment.

An embodiment of an electrical system 100 is shown in FIG. 1. The electrical system 100 includes a contactor unit 102 having a conductive element 104 (e.g., bus bar) and a contactor 106 configured to regulate a flow of current through the conductive element 104. The current through the conductive element 104 may be used to power an external load 108 (e.g., DC motor).

A control unit 110 may be used to regulate the operation of the contactor unit 102. The control unit 110 includes sensing circuitry 111 configured to monitor the operation of the contactor unit 102. The sensing circuitry 111 includes a first Hall circuit 112 and a second Hall circuit 114 which are independently configured to generate a measurement (e.g., voltage) based on the current through the conductive element 104. The first and/or second Hall circuits 112, 114 may include one or more Hall Effect sensors or current sensors to monitor the current flow in the conductive element 104. In some embodiments, suitable Hall Effect current sensors may include those found in co-pending application Ser. No. 15/693,929, filed Sep. 1, 2017, the contents of which are hereby incorporated by reference in their entirety.

The sensing circuitry 111 is communicatively coupled to an I2t unit 120. A multiplier circuit 122 is configured to square the instantaneous energy generated by the load 108. An integrator circuit 124, is configured to sum up the signal from the multiplier circuit 122 with respect to time. In some embodiments, the I2t unit 120 may be configurable by a remote user. In some embodiments, the I2t unit 120 may be remotely configurable, such as via a switch or selection circuitry. In an embodiment, the I2t unit 120 may be remotely configured by a signal provided via a multi-pin connector. In some embodiments, the I2t unit 120 may be configured for loads 108 having a nominal current capacity such as 100 amps, 200 amps, 300 amps, 400 amps, 500 amps or more amps.

If the temperature or level of the load 108 exceeds a predetermined threshold, a trip circuit 126 may cause the control unit 110 to regulate the operation of the contactor 106 to disconnect the load 108. In some embodiments, the control unit 110 may additionally be connected to a means (e.g., display, computer, wireless device (e.g., tablet, laptop, cell phone)) for notifying a remote user the status of the load 108. In one embodiment, the control unit 110 may notify the remote user that the load 108 has been disconnected. A reset circuit 128 may be provided in conjunction with the trip circuit 126 to cause the control unit 110 to regulate the operation of the contactor unit 102 allowing the load 108 to be connected. In some embodiments, the operation of the reset circuit 128 may be regulated by the remote user. In some embodiments, the reset circuit 128 may additionally provide the remote user the ability to activate/deactivate the contactor 102.

The control unit 110 may also regulate the operation of the contactor 106 to maintain operation of the load 108 in applications requiring near continuous service. In some embodiments, a coil current monitor 130 determines the duration that a pick up current has been applied to the contactor 106. If the pick up current duration is greater than a predetermined threshold, the coil current monitor 130 may cause the control unit 110 to regulate the operation of the contactor 106.

The control unit 110 may additionally regulate the operation of the contactor 106 to protect the load 108 from reverse currents. In some embodiments, a reverse current monitoring circuit 132 may receive from at least one of the first Hall circuit 112 and/or second Hall circuit 114 a measurement indicating a polarity of the Hall voltage resulting from a reverse current flow through the load 108. If the reverse current exceeds a predetermined threshold, the reverse current monitoring circuit 132 may cause the control unit 110 to regulate the operation of the contactor 106 to provide an open circuit to protect the load 108. In some embodiments, a reverse current monitoring enabling/disabling circuit 134 may enable a remote user to activate or deactivate this feature as desired.

Figure 2:
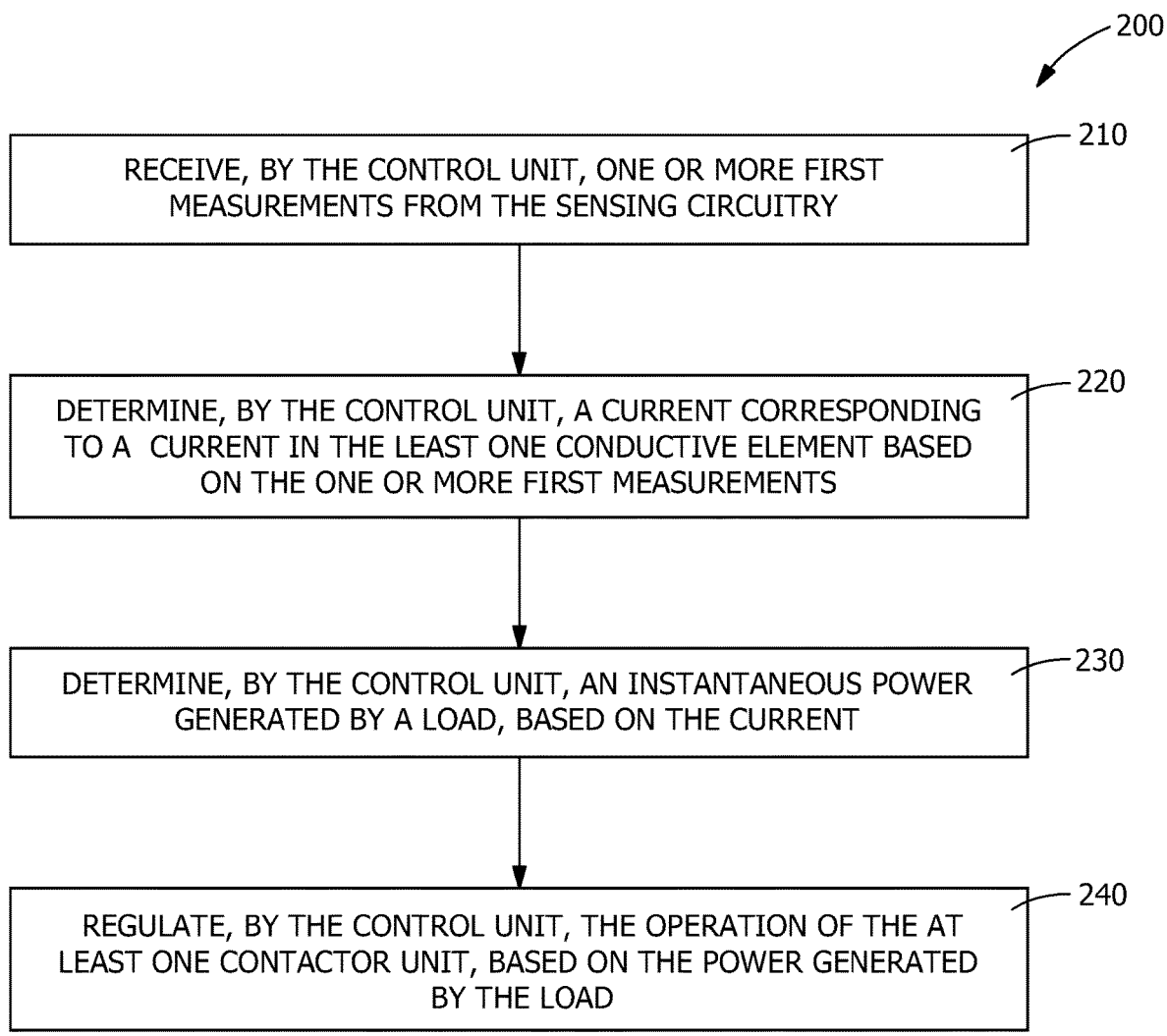
FIG. 2 is a flow chart of a method of operating an electrical system, according to an embodiment.

FIG. 2 is a flowchart 200 of a method 200 of regulating the operation of an electrical system. At block 210, the control unit 110 receives one or more first measurements from the sensing circuitry 111. At block 220, the control unit 110 determines a current corresponding to a current in the at least one conductive element 104 based on the one or more first measurements. At block 230, the control unit 110 determines an instantaneous power generated by a load 108 based on the current. At block 240, the control unit 110 regulates the operation of the at least one contactor unit 102 based on the power generated by the load 108.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A method of regulating the operation of an electrical system, the electrical system including, at least one contactor unit including a contactor and a conductive element, the method comprising:

receiving, by the control unit, a first measurements of a current flow in the conductive element from a first Hall Effect circuit and a second measurement of the current flow in the conductive element from a second Hall Effect circuit;

determining, by a control unit, a current corresponding to the current in the conductive element based on the first measurement and the second measurement, the control unit including a trip circuit, an I2t unit, and a coil current monitor;

squaring, by a multiplier circuit of the control unit, an instantaneous power generated by a load based on the current;

summing, by an integrator circuit of the control unit, a signal from the multiplier circuit with respect to time;

regulating, by a trip circuit and a reset circuit of the control unit, the operation of the at least one contactor unit based on the power generated by the load, wherein upon a level of the load exceeding a predetermined load threshold, the trip circuit will disconnect the load.

2. The method of claim 1, wherein the contactor includes an electromechanical switch.

3. The method of claim 1, wherein regulating the operation of the contactor includes switching between a first operating mode and a second operating mode.

4. The method of claim 3, wherein the first operating mode includes energizing the load.

5. The method of claim 4, wherein the second operating mode includes de-energizing the load.

6. The method of claim 1, wherein the first measurement includes a voltage measurement corresponding at least in part to a current in the at least one conductive element.

7. The method of claim 1, further comprising:

monitoring, by the at least one coil circuit monitor of the control unit, a duration that a pick up current is applied to the contactor, wherein if the duration of the pick up current is greater than a predetermined current duration threshold, the at least one coil current monitor will cause the control unit to regulate the operation of the contactor.

8. The method of claim 1, further comprising:

receiving, by a reverse current circuit of the control unit, a second measurement from the sensing circuitry indicating the polarity of a voltage resulting from a reverse current flow through the load.

9. The method of claim 8, wherein a reverse current monitoring enabling/disabling circuit is provided to allow a remote user to activate or deactivate the reverse current monitoring circuit.

* * * * *